United States Patent

Bhatt

[11] Patent Number: 5,774,512
[45] Date of Patent: Jun. 30, 1998

[54] HIGHER ORDER DIGITAL PHASE LOOP FILTER

[75] Inventor: Bhavesh Bhalchandra Bhatt, Franklin Park, N.J.

[73] Assignee: RCA Thomson Licensing Corporation, Princeton, N.J.

[21] Appl. No.: 666,463

[22] PCT Filed: Jan. 12, 1994

[86] PCT No.: PCT/US94/00390

§ 371 Date: Jun. 27, 1996

§ 102(e) Date: Jun. 27, 1996

[87] PCT Pub. No.: WO95/19676

PCT Pub. Date: Jul. 20, 1995

[51] Int. Cl.[6] .................................................. H04L 27/06
[52] U.S. Cl. .......................... 375/376; 375/350; 327/156
[58] Field of Search ..................................... 375/326, 327, 375/344, 345, 350, 355, 375, 376; 360/724.01; 327/142, 156

[56] References Cited

U.S. PATENT DOCUMENTS

| 3,967,102 | 6/1976 | McCown | 364/724.19 |
|---|---|---|---|
| 4,356,558 | 10/1982 | Owen et al. | 364/724.011 |
| 4,594,556 | 6/1986 | Ohta | 329/319 |
| 4,604,583 | 8/1986 | Aoyagi et al. | 329/308 |
| 4,920,278 | 4/1990 | Nawata | 327/3 |
| 4,985,900 | 1/1991 | Rhind et al. | 375/326 |
| 5,093,847 | 3/1992 | Cheng | 375/344 |
| 5,471,508 | 11/1995 | Koslov | 375/344 |
| 5,524,126 | 6/1996 | Clewer et al. | 375/355 |
| 5,604,741 | 2/1997 | Samueli et al. | 370/402 |
| 5,661,765 | 8/1997 | Ishizu | 375/376 |
| 5,675,612 | 10/1997 | Solve et al. | 375/326 |

*Primary Examiner*—Young T. Tse
*Attorney, Agent, or Firm*—Joseph S. Tripoli; Eric P. Herrmann; James B. Hayes

[57] ABSTRACT

A higher order phase loop filter includes an integrator consisting of an adder (25) and a delay element (31) arranged in a feedback loop between the output port of such adder and one of its input ports. Signal to be filtered is applied to a second input port of the adder. A detector (30) is coupled to the output of the adder to detect limiting values, which, when detected, conditions the detector to reset the current value in the delay element of the integrator to a fixed value such as zero. Resetting the delay element momentarily lowers the order of the filter and speeds system response time in the presence of noise.

5 Claims, 2 Drawing Sheets

HIGHER ORDER DIGITAL PHASE LOOP FILTER

This invention relates to circuitry for recovering pulse amplitude modulated, PAM, signals, and more particularly to loop filters utilized in such systems.

BACKGROUND OF THE INVENTION

PAM signals occur in several forms such as Quadrature Amplitude Modulated (QAM), Phase Shift Keying (PSK), and Quadrature Phase Shift Keying (QPSK), for example, the information of which are characterized by constellations representing a fixed number of discrete amplitude values. Recovery of the transmitted information requires recovery of the signal modulation carrier with appropriate phase control to insure proper orientation of the constellation. Typical PAM signal recovery systems are described by Lee and Messerschmitt in chapter 14 of DIGITAL COMMUNICATION, Kluwer Academic Pub., Boston Mass., 1992, an example of which is illustrated in FIG. 1 herein.

The FIG. 1 apparatus includes a source of PAM signal (not shown) which is applied to a mixer 11. Mixer 11 may be a complex multiplier, having a first input port for receiving the PAM signal and a second input port for applying a recovered carrier signal. The mixer 11 provides a baseband signal to a phase circuit including a slicer 12 and a decision circuit 13. The decision circuit 13 determines the difference between the amplitude of the received signal and the amplitude of the most probable constellation value, and outputs this difference as an error e. The combination of the elements 11, 12 and 13 form one of many alternative phase detectors (10). The output of the phase detector is applied to a loop filter 14, which is incorporated to provide a measure of noise immunity and to establish the system timing capture parameters. The output of the loop filter is a control signal, C, which is coupled to control a controlled oscillator 15. If the mixer 11 is realized in analog form the oscillator 15 may be an analog voltage controlled oscillator arranged to provide two signals having a 90 degree phase relation. Alternatively, if the mixer is realized in digital form (i.e., to process digital PAM signal) the oscillator may be a controlled discrete time oscillator DTO.

FIG. 2 illustrates a known second order loop filter circuit which, may be implemented for the filter 14 in FIG. 1. This fiter is shown realized with digital circuit elements and presumed to operate in sampled data manner. In FIG. 2, the error signal e from the phase detector is applied to first and second scaling circuits 23 and 24 which respectively weight the error signal by weighting factors K1 and K2. Error signal samples which are weighted in element 23 are delayed one sample period in delay element 22 and applied to an adder 20. Error signal samples which are scaled in element 24 are applied to an integrator including a signal summing circuit or adder 25 and a one sample period delay element 26 coupled between the output port of the adder 25 and one of its input ports. The output signal from the integrator is applied to a second input port of the adder 20 via a limiter circuit 27.

It will be recognized by those skilled in filter design that the upper circuit path provides a response to instantaneous signal changes while the lower circuit path provides a response to longer term signal trends. In the steady state the phase error is zero or very small, and the transfer function H(z) of the FIG. 2 circuit may be represented by the equation;

$$H(z)=K1(z^{-1})+K2/(1-z^{-1}). \qquad (1)$$

where K1 and K2 are constant weighting factors. Equation (1) assumes that the output of the integrator is sufficiently small that no signal limiting is incurred. However, if there is significant noise in the received signal, the noise will be reflected in the error signal, and the output of the integrator may be limited. Assume that the limiting value is K3. When limiting occurs the transfer function of the loop filter becomes;

$$H(z)=K1(z^{-1})+K3 \qquad (2)$$

The limiting action reduces undesirable effects due to signal noise, such as false lock. However, when the system is operating in the limiting mode, the term K3 will normally dominate which results in undesirably slow response times.

The present invention is intended to incorporate the advantageous aspects of incorporating the effects of a limiter in a loop filter without incurring the undesirable aspects.

SUMMARY OF THE INVENTION

The present invention is a higher order phase loop filter which includes an integrator of the form comprised of a siganl summing circuit or adder and a delay element arranged in a feedback loop between the output of such adder and an input port. Signal to be filtered is applied to a second input port of the adder. A detector is coupled to the output of the adder to detect limiting values, which when detected, conditions the detector to reset the current value in the delay element of the integrator to a fixed value such as zero. Resetting the delay element momentarily lowers the order of the filter and speeds system response time in the presence of noise.

BRIEF DESCRIPTION OF THE DRAWINGS

The invention will be more readily understood with reference to the drawings wherein.

DETAILED DESCRIPTION

Figure 1:
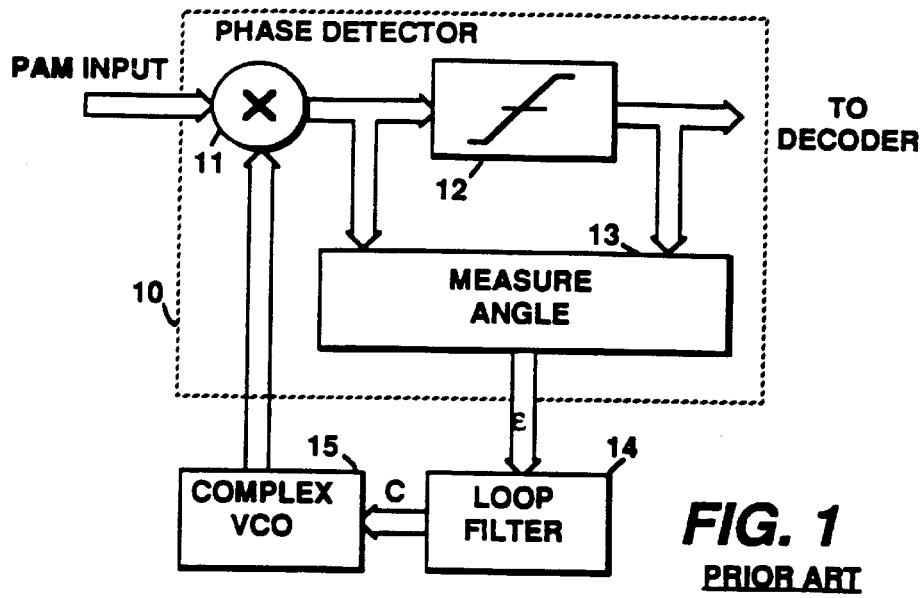
FIG. 1 is a block diagram of a prior art phase locking system.
Figure 3:
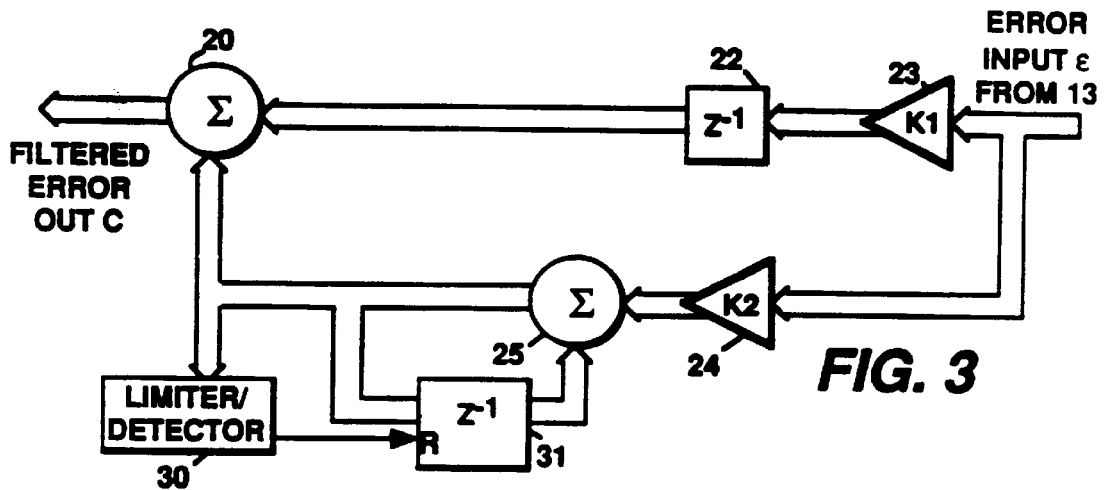
FIGS. 3 and 5 are block diagrams of loop filters embodying the present invention.

Refer to FIG. 3 which illustrates an exemplary embodiment of the invention. In the FIGURE an error signal e, from for example, the phase detector 10 of FIG. 1, is applied to first and second scaling circuits 23 and 24 which respectively scale the error signal by values K1 and K2. Exemplary values of K1 and K2 are ¼ and ¹/₃₂. Signal weighted by the factor ¼ from the scaling circuit 23 is coupled to a delay element 22. The error signal is assumed to be a sampled data signal and the delay element 22 delays signal by one sample period. Delayed signal from delay element 22 is coupled to a first input port of an adder 20.

Signal weighted by the scale factor K2, from scaling circuit 24 is applied to an integrating circuit including a signal summing circuit or adder 25 and a delay or signal storage element 31. The delay element 31, delays signal sums output from the adder 25 by one sample period, and applies the delayed sums to an input port of the adder 25.

The output sums from the adder 25 are coupled to a second input port of the adder 20. The output sums from the adder 25 are also applied to a detector 30, which provides a reset signal whenever the sums provided by the adder 25 exceed predetermined limiting values. (For a 16 bit adder the limiting values may be ±4000 hexadecimal.) The reset signal provided by the detector 30 is coupled to reset the value in the delay element 31 to a predetermined reset value such as zero.

For small valued error signals the transfer function of the FIG. 3 loop filter is described by equation 1. When signal noise causes the integrator to generate output values in excess of the limiting values, the transfer function is given by;

$$H(z)=K1(z^{-1})+K2 \qquad (3)$$

Note however, that the factor K1 is significantly larger than the factor K2, thus the loop filter effectively, momentarily reverts to a first order loop. That is the second term on the right side of equation (3) may be ignored. When the loop filter reverts to a first order loop it will inherently have a faster lock-in time, in the presence of noise. In addition resetting the integrator to a small value diminishes cumulative effects due to the signal noise.

In FIG. 3, the detector 30 is illustrated as a limiter and may in fact be realized with appropriate parts of limiter circuitry. However detector 30 may better be characterized as a window comparator which provides an output signal having a first state, e.g., zero, for all applied input values occurring between designated limits, and a second output state, e.g., a logic one state, otherwise.

Figure 2:
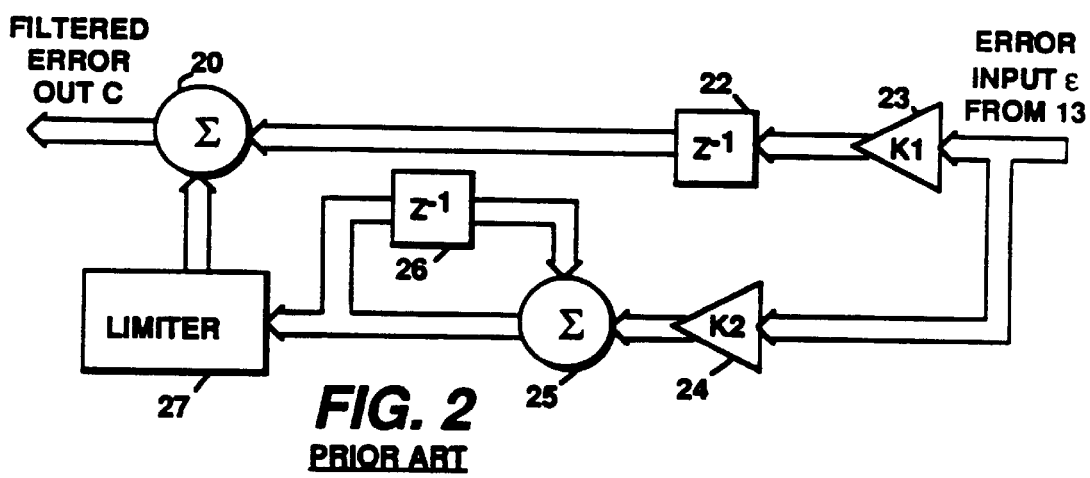
FIG. 2 is a block diagram of a known loop filter of the type which may be implemented for the loop filter 14 of FIG. 1.
Figure 4:
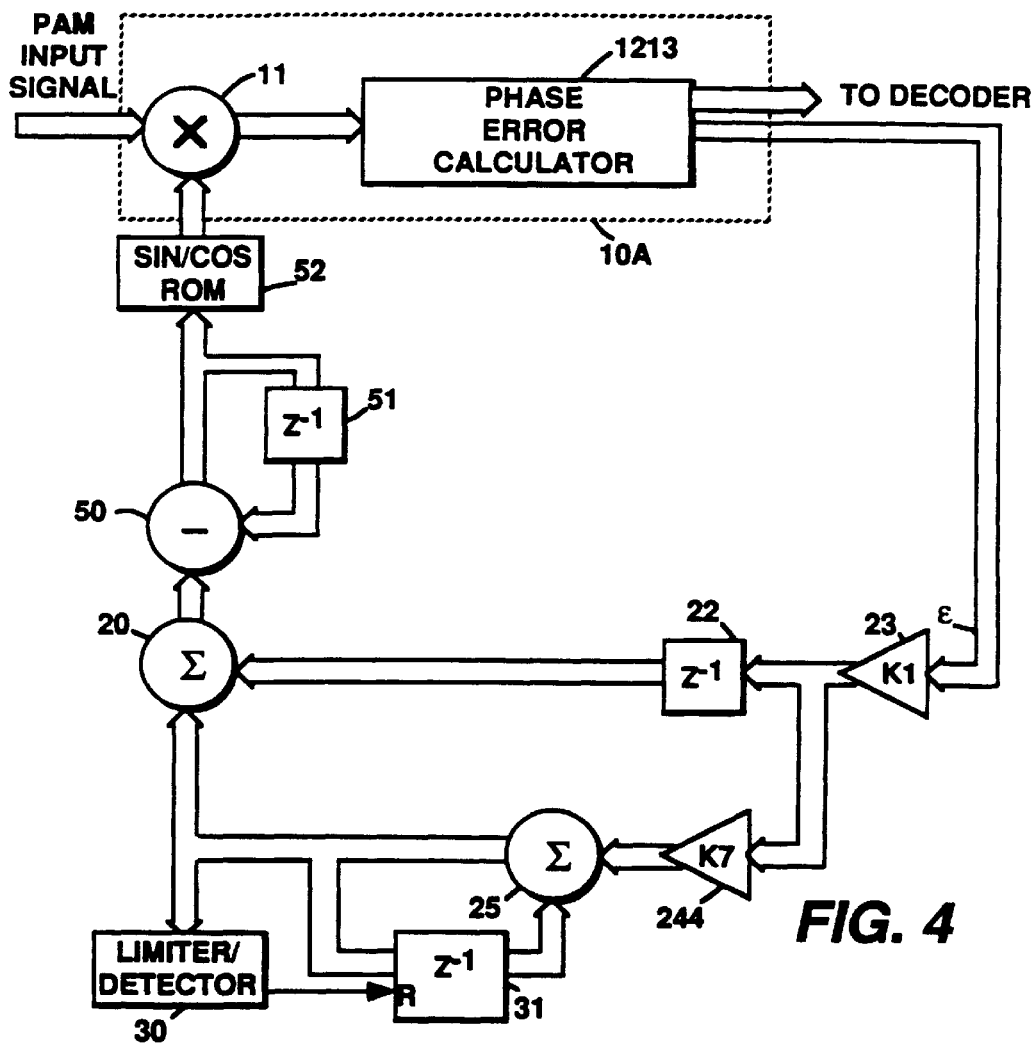
FIG. 4 is a block diagram of a carrier recovery phase correction system embodying the present invention.

The FIG. 1 system is of the type which will correct both frequency and phase errors. FIG. 4 illustrates a system for correcting only phase errors. In FIG. 4 elements designated with like numbers to elements in FIGS. 1–3 are similar and perform similar functions. The phase detector 10A may be similar to phase detector 10 of FIG. 1 or it may take the form of any other known phase detector. Phase corrected signal is available at the output of the mixer 11. The loop filter is similar to the loop filter shown in FIG. 3, with the exception that the second scaling circuit 244 is in cascade connection with the first scaling circuit 23 rather than being in parallel as shown in FIGS. 2 and 3. The weighting factor K7 of the second scaling circuit 244 is arranged such that K1 times K7 equals K2.

Consider a QAM signal applied to the input of the mixer 11 and assume that the mixer 11 is a complex multiplier. The QAM signal has in-phase I and quadrature-phase Q components.

Corrected component signals Ic and Qc may be obtained according to the relationships given by;

$$Ic=I\cos(\theta)+Q\sin(\theta) \qquad (4)$$

$$Qc=Q\cos(\theta)-I\sin(\theta). \qquad (5)$$

If complex multiplier values representing $\cos(\theta)$ and $\sin(\theta)$ are applied to the mixer from the loop filter, the complex multiplier 11 will inherently generate the phase corrected component signals. The values $\cos(\theta)$ and $\sin(\theta)$ are quadrature representations of the filtered error signal $\epsilon$.

Signal from the loop filter, that is from adder 20, are coupled to one input port of a subtracter 50. The output of the subtractor is coupled to its other input port via a one sample period delay element 51. The combination of subtracter 50 and delay element 51 form a differentiator, which is in effect a bandpass filter, that can only pass phase error changes. The bandpass filtered (differentiated) phase errors are coupled to a look-up table 52 which may be realized with a read-only-memory or ROM. The ROM provides pairs of values corresponding to $\cos(\theta)$ and $\sin(\theta)$ values, where $\theta$ is given by;

$$\theta=\{1/(1+z^{-1})\}\{K1(z^{-1})+K2/(1-z^{-1})\}\{e\} \qquad (6)$$

Figure 5:
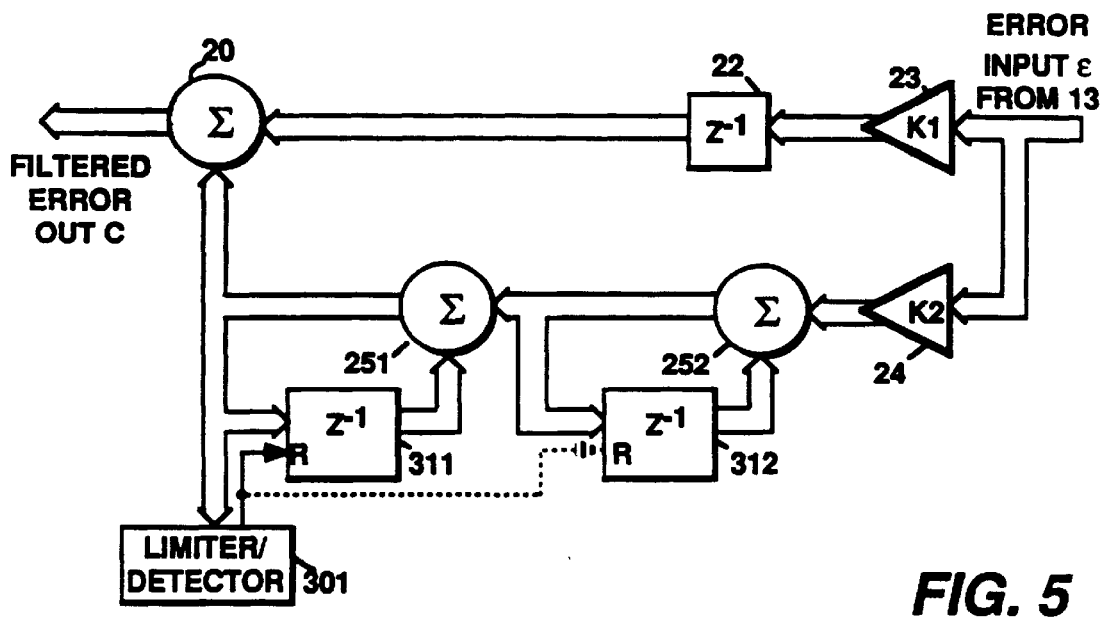

FIG. 5 is an example of a higher order loop filter using the same limiting concepts as those illustrated and described with respect to FIGS. 3 and 4. The dashed arrow between the limiter/detector 301 and the delay element 312 is intended to indicate that this connection is optional.

What is claimed is:

1. In a carrier recovery circuit including a loop filter (14) of the form which includes a signal summing circuit (25) and a signal storage element (31) coupled between an output port and an input port of said signal summing circuit to form an integrator, an improvement comprising; detection means (30) coupled to said signal summing circuit, for detecting when sums output from said signal summing circuit exceed predetermined limits, and for resetting signal in said storage element to a predetermined value when such sums exceed such limits.

2. The circuit set forth in claim 1 wherein said means responsive to the detection of sums exceeding such limits, resets signal in said storage element to a zero value.

3. A loop filter for a phase locked loop comprising:

a source of error signal (10);

an adder (20) having first and second input terminals, and an output terminal for providing filtered error signal;

a first circuit path (22, 23) coupled between said first input terminal and said source, and including a series connection of a first signal scaling circuit and a delay element;

a second circuit path (24, 25, 31) coupled between said second input terminal and said source, and including a signal integrator, said integrator including:

a signal summing circuit (25) having a further signal delay element coupled between an output port and an input port thereof;

a detector (30) for detecting when sums provided by said signal summing circuit exceed predetermined values, and for resetting said further delay element (31) to a predetermined value when said sums exceed such predetermined values.

4. The loop filter set forth in claim 3 wherein said detector resets said further delay element to a zero value.

5. Apparatus including a loop filter comprising:

a source of signal including a carrier component;

a multiplier having a first input coupled to said source, having a second input and an output terminal;

phase calculating means, coupled to the output terminal of said multiplier, for providing at an output terminal thereof, a phase error signal indicating the difference in phase of said carrier component from a desired carrier phase;

an adder having first and second input terminals, and an output terminal for providing filtered error signal;

a first circuit path coupled between said first input terminal of said adder and said output terminal of said phase calculating means, and including a series connection of a first signal scaling circuit and a delay element;

a second circuit path coupled between said second input terminal of said adder and said output terminal of said phase calculating means, and including a series connection of a second signal scaling circuit and a signal integrator, said integrator including:
a signal summing circuit having a further signal delay element coupled between an output port and an input port thereof;
a detector for detecting when sums provided by said signal summing circuit exceed predetermined values, and for resetting said further delay element to a predetermined value when said sums exceed such predetermined values.

means including a differentiator coupled between the output terminal of said adder and the second input terminal of said multiplier.

* * * * *